United States Patent [19]

Batchelder

[11] 4,402,062

[45] Aug. 30, 1983

[54] METHOD AND APPARATUS FOR DIELECTROPHORETIC STORAGE AND RETRIEVAL OF INFORMATION

[76] Inventor: J. Samuel Batchelder, 85 Allison Rd., Katonak, N.Y. 10536

[21] Appl. No.: 263,355

[22] Filed: May 14, 1981

[51] Int. Cl.³ .............................................. G11C 11/42
[52] U.S. Cl. ..................................... 365/153; 365/127; 340/783; 340/787
[58] Field of Search ............... 340/787, 763, 765, 783; 365/149, 153, 127

[56] References Cited

U.S. PATENT DOCUMENTS

| | | | |
|---|---|---|---|
| 3,634,853 | 1/1972 | Hedges | 365/153 |
| 3,806,893 | 4/1974 | Ohnishi et al. | 365/153 |
| 4,079,368 | 3/1978 | DiStefano | 365/153 |
| 4,126,854 | 11/1978 | Sheridon | 340/324 M |

OTHER PUBLICATIONS

Lewis et al., "Recent Developments in Light Modulating Displays", Electronic Equipment News, 6/75, pp. 22-23.

*Primary Examiner*—Stuart N. Hecker
*Attorney, Agent, or Firm*—Parmelee, Bollinger & Bramblett

[57] ABSTRACT

The present invention provides a method and apparatus for storing and retrieving information using the phenomenon of dielectrophoresis. First and second materials are contained within a housing, and a non-uniform electrical field is applied to the materials. The materials have different dielectric constants, and relative movement of the materials occurs as a result of dielectrophoretic forces resulting from the applied non-uniform field. Different positions of one of the materials within the housing correspond to stored information and varying the applied non-uniform field varies the position of the one material to change the corresponding information. A detector is provided to locate the position of the one material in the housing corresponding to the stored information to retrieve the information represented by that position.

15 Claims, 6 Drawing Figures

METHOD AND APPARATUS FOR DIELECTROPHORETIC STORAGE AND RETRIEVAL OF INFORMATION

BACKGROUND OF THE INVENTION

The present invention is based on the phenomenon of dielectrophoresis—the translational motion of neutral matter caused bu polarization effects in a non-uniform electric field. The dielectrophoresis phenomenon was first recorded over 2500 years ago when it was discovered that rubbed amber attracts bits of fluff and other matter. Over 300 years ago, it was observed that water droplet change shape as they approach a charged piece of amber. The basic concept of dielectrophoresis is examined in detail in a text entitled *Dielectrophoresis* by Herbert H. Pohl, published in 1978 by the Cambridge University Press. Further discussion of this phenomenon also can be found in an article by W. F. Pickard entitled "Electrical Force Effects in Dielectric Liquids," *Progress in Dielectrics* 6 (1965)—J. B. Birks and J. Hart, Editors.

All known practical applications of the dielectrophoresis phenomenon have been directed to either separators or clutches. For example, U.S. Pat. No. 1,533,711 discloses a dielectrophoretic device that removes water from oil; U.S. Pat. No. 2,086,666 discloses a dielectrophoretic device which removes wax from oil; U.S. Pat. No. 2,664,246 discloses a dielectrophoretic separator used in a sludge treatment process, U.S. Pat. No. 2,914,453 provides for separation of solid polymeric material from fluid solvents; U.S. Pat. No. 3,162,592 provides for separation of biological cells; U.S. Pat. No. 3,197,393 discloses a separator using centripetal acceleration and the dielectrophoretic phenomenon; U.S. Pat. No. 3,304,251 discloses dielectrophoretic separation of wax from oil; U.S. Pat. No. 3,431,441 provides a dielectrophoretic separator which removes polarizable molecules from plasma; U.S. Pat. No. 3,980,541 discloses separation of water from fluid; and U.S. Pat. No. 4,164,460 provides for removal of particles from a liquid. U.S. Pat. Nos. 3,687,834; 3,795,605; 3,966,575; and 4,057,482 disclose other dielectrophoretic separators for removing particulates and water from a fluid. Other separators, not necessarily dielectrophoretic separators, are disclosed in U.S. Pat. Nos. 465,822; 895,729; 3,247,091 and 4,001,102.

U.S. Pat. No. 2,417,850 discloses a clutch mechanism using the dielectrophoretic phenomenon.

The object of the present invention is to provide a method and apparatus for storing and retrieving information using the phenomenon of dielectrophoresis. A variety of electronic memory devices are well known in the art. The two general classes of such memory devices are electric field devices, such as static and dynamic random access memories, (RAM), and charge-coupled devices, (CCDs), while the second class is magnetic field devices, such as cores, disk, tape, and magnetic bubbles. In general, the very fast random access memories are expensive, due in part to the high cost of their substrate material. Large capacity memories are less expensive when constructed out of magnetic materials, however the time required to access the data usually increases with the data capacity. Magnetic systems such as disk and tape can have high data transfer rates, but they are subject to mechanical wear. Magnetic bubble memories have no moving mechanical parts, but also have slower data rates and more expensive substrate materials. The present invention provides a non-volatile random access memory of moderate speed, requiring a very low cost substrate material. The data capacity and speed of this device place it between the fast electric field devices and the large capacity magnetic field devices in performance. The design is insensitive to electromagnetic noise and cosmic ray effects, and can operate over a wide temperature range. Information is stored by the manipulation of materials by dielectrophoretic forces resultant from the application of non-uniform electric fields thereto.

SUMMARY OF THE INVENTION

The present invention provides a method and apparatus for storing and retrieving information based on the phenomenon of dielectrophoresis. First and second materials having different dielectric constants are enclosed within a housing. Means are provided for applying a non-uniform electrical field to the materials, causing relative movement of the materials as a result of dielectrophoretic forces thereon resulting from the non-uniform field. The position of one of the materials corresponds to stored information. Varying the applied non-uniform field varies the position of that one material, which changes the stored information represented by the position of that material. Means are provided to detect the position of that material within the housing and thereby retrieve the stored information represented by its position.

BRIEF DISCUSSION OF THE DRAWINGS

FIG. 1 of the drawings diagrammatically represents a charged parallel plate capacitor causing movement of a slab of material as a result of dielectrophoretic forces;

FIG. 2 diagrammatically represents a pair of parallel capacitor plates and the necessary charges thereon for holding a slab of material at different positions relative to the capacitor plates;

FIG. 2A diagrammatically represents a first embodiment of the present invention in which a slab of material is selectively moved into either of two information representing positions as a result of dielectrophoretic forces;

FIG. 3 diagrammatically represents a further embodiment of the present invention including a plurality of the units illustrated in FIG. 2A;

FIG. 4 is a block diagram of one example of an interfacing system to be used with the present invention; and FIG. 5 is a diagram subdividing the array shown in FIG. 3 into different regions labeled I-IV to illustrate the operation of the memory system in accordance with Table I of the specification.

DESCRIPTION OF THE PREFERRED EMBODIMENTS

Figure 1:
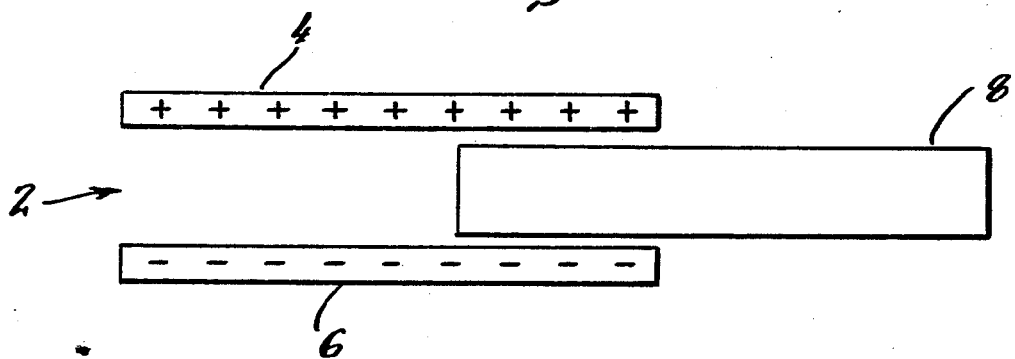

The present invention utilizes the phenomenon known as dielectrophoresis, or the motion of electrically neutral matter in non-uniform electric fields caused by polarization effects in the neutral matter. Matter is polarizable to the extent that electric charges are mobile inside the material, specifically to the extent that the electric charge can respond to external electric fields. The polarizability of material, at low frequencies, is measured by the dielectric constant. For example, the dielectric constant of a vacuum, which has no mobile charges, is one, and the dielectric constant of a metal, which contains charges that are so mobile that the material is termed a conductor, is infinite. [Since the low frequency dielectric constant of a conductor is not a directly measurable quantity, moderate and good conductors are not generally considered dielectric materials. However, the induced polarization in a conductor due to an external electric field is approximately the same as the induced polarization in a non-conducting material with a large but finite dielectric constant. The induced polarization determines the strength of the attractive force, so that a conductor may properly be considered as being subject to a dielectrophoretic force.] It is well known that a material with a higher dielectric constant will experience a force tending to move it into a region of stronger electric field, and in the process it will displace a material with a lower dielectric constant. Such a process is shown in FIG. 1; a parallel plate capacitor, 2, with some potential difference between its two plates 4 and 6, will contain an electric field between the two plates. A slab of material 8 having a higher dielectric constant than the surrounding medium, will be attracted into the region between the capacitor plates. The slab will move into the region between the plates at a rate determined by a variety of factors: its dielectric constant, the dielectric constant of the surrounding material, the voltage and geometry of the capacitor, the viscosity of the surrounding material, and any other forces which may be acting on the slab, such as gravity and surface interactions.

A memory device requires two attributes. It must be possible to write into, and to read from the device. As just shown, a dielectric slab can be moved in between electrodes, and shortly in will be shown how the slab can be moved out again. This motion corresponds to writing in the memory. Information is stored as the relative position of the slab. In order to read the memory, detection of the position of the slab is necessary. If the speed of sound in the bubble is substantially different in the slab than in its surroundings, the position might be detected ultrasonically by techniques well known in the art. Similarly, if the optical properties of the slab are substantially different than that of the surrounding material, the position of the slab might be detected optically. An alternative technique is to measure the change in the resistivity between the electrode pairs. However, the most likely way to detect the position of the slab is electronically by using the same mechanism that allowed the slab to be manipulated. Two electrodes will have a mutual capacitance which is determined by their geometry and by the dielectric constant of the material surrounding them. If a slab of higher dielectric material is introduced between the electrodes, the mutual capacitance of the two electrodes will increase. Thus, the position of the slab 8 can be determined by a measurement of the mutual capacitance between electrodes 4 and 6.

In the following discussion, the material being moved will be referred to interchangeably as a dielectric slab, a dielectric bubble, or as a dielectric particle. These names refer to an isolated region in space containing a material of substantially different dielectric constant than its surroundings. This could be a solid material, a liquid, or a gas.

Figure 2:
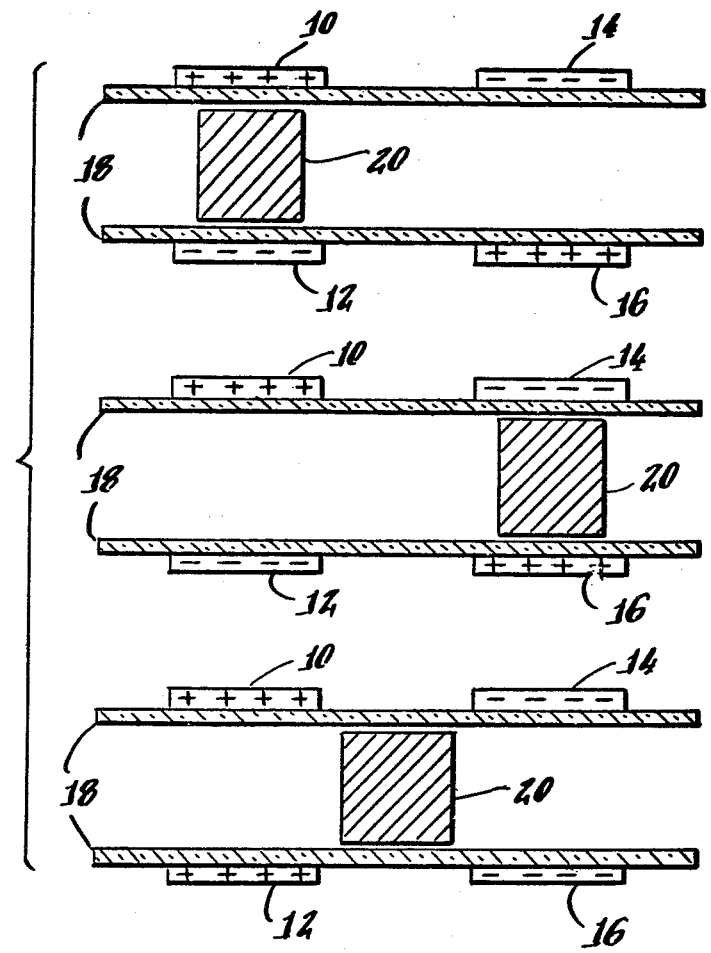
Figure 2A:
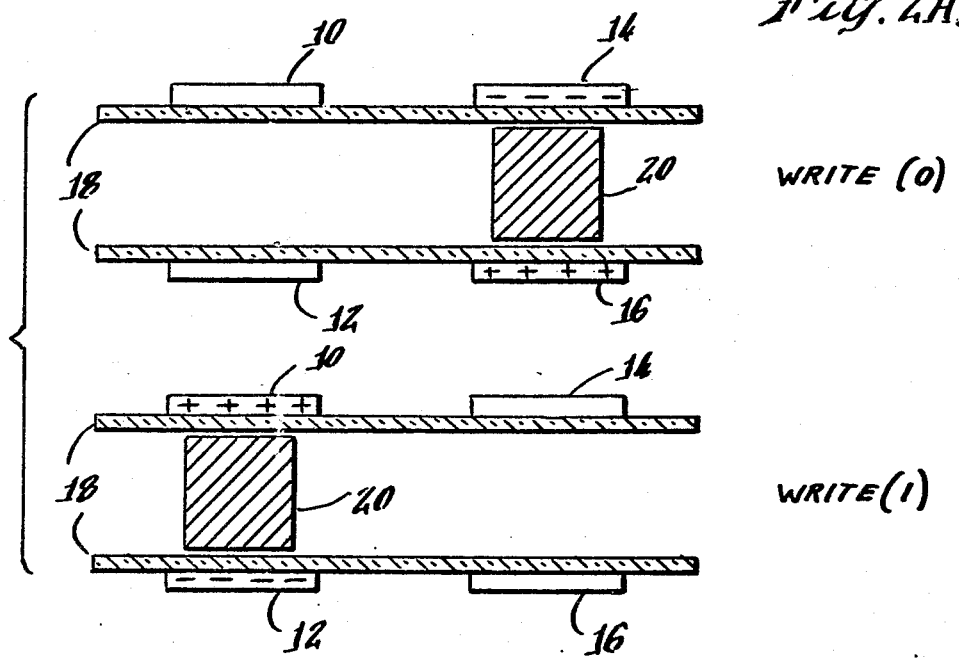

Instead of a single pair of capacitor plates, two pairs of electrodes are shown in FIG. 2. Electrodes 10 and 12 form one pair, and electrodes 14 and 16 form the other. Two insulating plates 18 separate the electrodes and enclose both a low dielectric low viscosity medium and the high dielectric slab 20. This geometry provides a simple memory cell. For illustrative purposes, of the slab is on the left, the cell is storing a 1, and if the slab is on the right, the cell is storing a 0, so that it is a binary memory cell. FIGS. 2 and 2A show the different states of this cell. With electrodes 10 and 16 held at a voltage $V+$ and electrodes 12 and 14 held at a voltage $V-$, strong electric fields are localized between the individual electrode pairs. This allows the slab to be clamped at either the (0) and (1) position. Two steps are required to write to the cell. The first is to set electrodes 10 and 12 to $V+$ and electrodes 14 and 16 to $V-$. Now the electric fields are strongest between the two pairs of electrodes, so that the slab will center itself. To write a (0), electrode 14 is set to $V-$, electrode 16 is set to $V+$, and electrodes 10 and 12 are set at zero relative potential. Similarly, to write a (1), electrodes 14 and 16 are held at zero, while electrode 10 is set to $V+$ and electrode 12 is set to $V-$.

Alternative electrode configurations create bubble movement perpendicular to the plane of the electrode array rather than parallel to it. Since the slab is attached to regions of higher electric field density, a field between two electrodes of dissimilar geometry will cause the slab to move towards the smaller electrode.

The potentials of various electrodes have been denoted by the d.c. voltage levels $V+$ and $V-$ for illustrative purposes. However, the sign of the field, which is determined by the relative potentials on both electrodes, is immaterial, because, for electrically neutral bubbles of dielectric material, the force that they experience due to the voltages on the electrodes is attractive and independent of sign. In practice, the dielectric media have some non-negligible electronic or ionic conductivity. Ions in the surrounding medium will migrate under the influence of the electrode fields and configure themselves so as to shield the dielectric bubble from these external fields. This is usually an undesirable effect. Accordingly, the actual voltages applied to the electrodes are made constant in absolute value and caused to oscillate in time at a rate sufficient to decrease ionic shielding to an acceptable level.

Figure 3:
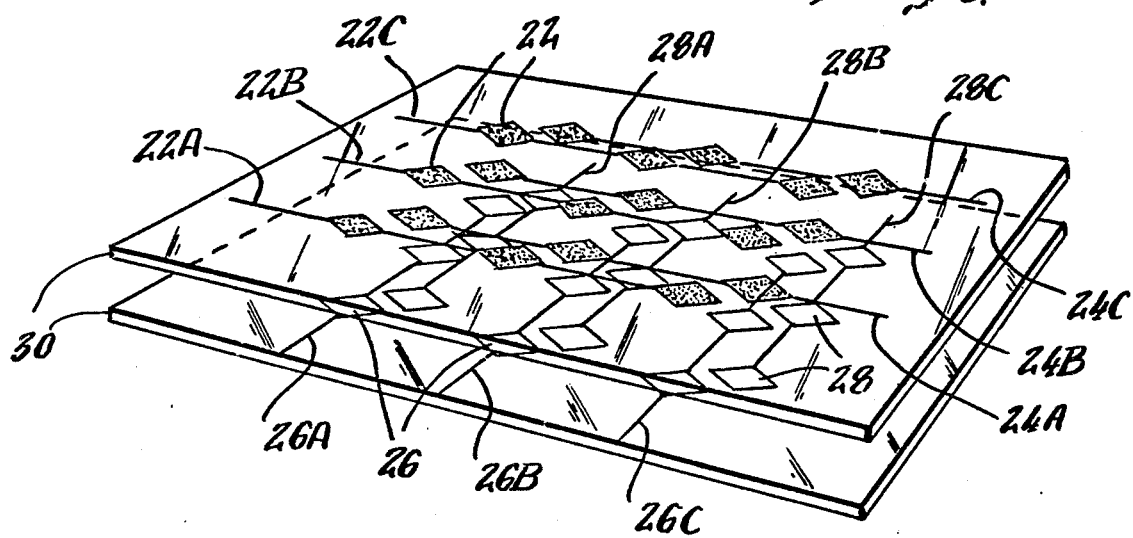

Although reference has been made to a higher dielectric bubble surrounded by a lower dielectric medium, the opposite configuration is also possible. If a bubble of a lower dielectric medium is immersed in a higher dielectric surrounding, it will tend to be repelled by dielectrophoretic forces. FIGS. 2-3 illustrate insulators placed between the electrodes and the mobile dielectric materials. These are not necessary if the conductivity of the dielectric media is low enough, and if there are no detrimental interactions between the electrode material and the dielectric media.

The electrode arrays illustrated in FIGS. 1-3 allow for manipulation of the bubble position in only one dimension. However, it is clear that such techniques can be extended to give manipulation capability in two or three dimensions as well. The two pairs of electrodes in FIG. 2 can be extended to an arbitrary number of electrode pairs in two dimensions. In addition, multiple arrays of electrodes can allow for the vertical movement previously described.

Special consideration must be placed on the effects of surface wetting or adhesion, surface tension, and viscosity in a dielectrophoretic manipulator. All electrically neutral materials attract each other, to a greater or lesser degree, by the Van der Waals interaction, which is the microscopic counterpart of the dielectrophoretic interaction. Because of this attraction, any material which is to be manipulated will tend to be attracted to the containing surfaces of the device. That attraction can cause adhesion to or, in the case of fluids, wetting of the containing surfaces by the material to be manipulated, which degrades the performance of the device. To overcome this effect, a secondary material may be placed between the material being manipulated and the containing surfaces, with the characteristic that this secondary material is more attractive to the material being manipulated than the containing surfaces are. The secondary material can take the form of a lubricant that coats the containing surfaces, or of a low viscosity fluid (or gas) that fills the volume between the containing surfaces. For example, if water, with a dielectric constant of 76, is the material to be manipulated, and glass insulators form the containing surfaces, a surrounding field that is effective at preventing the water from wetting the glass is heptane, with a dielectric constant of 1.9, containing five percent octyl alcohol. It is important to keep the viscosity of the surrounding material as low as possible to afford the least resistance to the movement of the material being manipulated. Finally, if the material being manipulated is fluid, there may be a requirement to generate small bubbles from larger ones. This can be accomplished by at least four techniques. Moving a fluid bubble rapidly in a viscous medium causes the larger bubble to break down into smaller ones due to viscous drag. The velocity required to perform this fissioning process depends upon the surface energy between the bubble and the surrounding medium. For example, in the case of water is heptane, the addition of two percent of the detergent Triton-X 100 to the water lowers the surface energy between the water and the heptane from one than thirty to less than ten dynes per centimeter. Another technique for fissioning bubbles is to use neighboring inhomogeneous field regions. Roughly speaking, bubbles will split in two if it is energetically favorable to occupy separate regions of higher field. If a bubble is charged, it can break up into smaller bubbles due to mutual repulsion of the like charges on the original bubble. Alternative techniques for creating small bubbles include forcing the fluid through a small orifice.

Although the first and second materials can have arbitrary densities, it is preferable to closely match the two densities in order to minimize the effects of gravity and vibration.

The preceding technical description is applicable to all dielectrophoretically driven memory devices. Certain design considerations will be made more clearly understandable via the development of a particular memory design.

Since the dielectric bubbles are made up of neutral matter, they do not disappear when power is removed from the memory. If no forces act upon the bubbles, they remain stationary, and as such the memory is non-volatile. If the density of the bubbles and the surrounding material is not matched, gravity and vibration can disturb their positions. Because of this effect, it might prove necessary to maintain a holding field on each of the bubbles. The power consumption of such a holding field is such that a small battery might power the device for long periods of time. In this case, the memory is non-volatile in the sense that some common c-mos memories are non-volatile.

Figure 5:
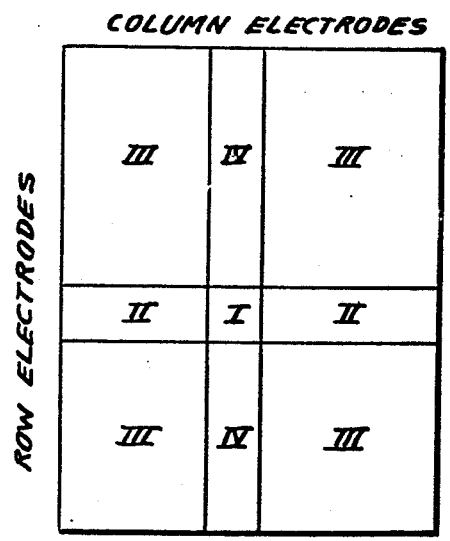

Random access, or array accessing of each memory bit, is the preferred embodiment of the dielectrophoretic memory. FIG. 3 shows a possible electrode configuration for a three by three array of memory cells. The number of cells illustrated in this FIGURE is small for visual clarity. Electrodes 22 and 24 are mounted on the upper side of the upper insulating support plate 30, and similarly electrodes 26 and 28 are mounted on the lower side of the lower support plate 30. The electrode pads are clustered in groups of four, two above and two below. They are electrically interconnected, and addressible, in groups designated by the suffix letters "A", "B", and "C". The square pads of electrode material in FIG. 3 correspond to their rectangular counterparts in FIG. 2. To successfully access a single cell in the array, it is necessary that none of the other cells in the array are effected by the manipulations of the cell in question. Specifically, as shown in FIG. 5, if accessing a memory cell at position (I) is a two-dimensional array, it is necessary that cells in the same row (II), cells in the same column (IV), and cells not in the same row or column (III) are not affected. Table 1 below shows the appropriate voltages which should be applied to the twelve electrodes 22–28 for the regions I-IV, in order to perform the following operations: hold the entire array constant, center the bubble material in the cell at (I) without disturbing the rest of the array, and subsequently writing a (1) or a (0) to cell (I) while holding the rest of the array constant. Thus when the memory is not being accessed,

TABLE 1

| Electrode | hold | center | write (1) | write (0) |
|---|---|---|---|---|
| I-22 | V+ | V+ | V+ | 0 |
| I-24 | V− | V− | 0 | V− |
| I-26 | V− | V+ | V− | 0 |
| I-28 | V+ | V− | 0 | V+ |
| II-22 | V+ | 0 | V+ | V+ |
| II-24 | V− | 0 | V− | V− |
| II-26 | V− | V+ | V− | 0 |
| II-28 | V+ | V− | 0 | V+ |
| III-22 | V+ | 0 | V+ | V+ |
| III-24 | V− | 0 | V− | V− |
| III-26 | V− | 0 | V− | V− |
| III-28 | V+ | 0 | V+ | V+ |
| IV-22 | V+ | V+ | V+ | 0 |
| IV-24 | V− | V− | 0 | V− |
| IV-26 | V− | 0 | V− | V− |
| IV-28 | V+ | 0 | V+ | V+ | the entire array is in the hold state. To write to a given cell, the higher dielectric material in the cell is first centered and then is placed in the desired position. To read the contents of the cell, we measure the mutual capacitance between the electrode pair 22 and 26 corresponding to the memory cell of interest. If the capacitance is above a threshold value, the slab is positioned between the electrodes, and the cell is storing a (1). Similarly, if the capacitance is below that same value, the slab is between electrodes 24 and 28, so the cell is storing a (0).

Figure 4:
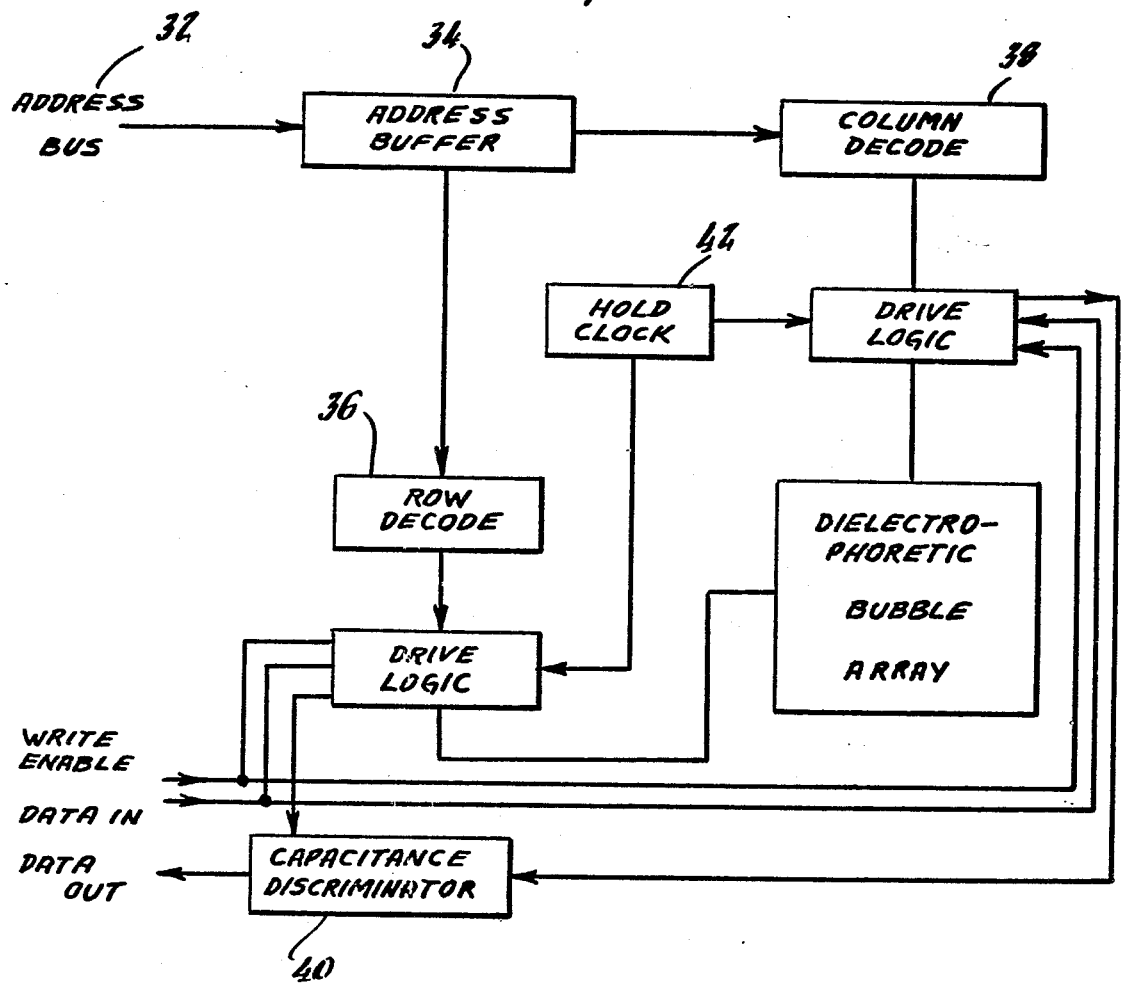

The preceding prescription for accessing memory cells in a dielectrophoretic memory array might be too involved to be directly interfaced with electronic devices which might use such a memory. It is necessary to ensconce the array in a variety of other circuits, which then provide standard interfacing with the outside world. FIG. 4 shows an example of such a possible interfacing arrangement. The particular cell of interest is chosen by the state of the address bus 32 in the upper left of the block diagram. This is strobed into a buffer 34, which then drives row and column decode circuits 36 and 38 which select the appropriate cell from the address. If the write-enable line is false, the appropriate memory cell will be read from, and if true, the cell will be written to. Reading the cell is accomplished by connecting the proper electrodes to the capacitance discriminator 40, which outputs a logic (0) or (1) as described above. Writing to the cell is accomplished by centering the dielectric slab, and then moving it to the desired position, as dictated by the data in signal. As described previously, residual ionic conduction requires that voltages specified as V+ in Table 1 are actually symmetric waveforms about zero volts, and voltages denoted as V− are identical waveforms 180 degrees out of phase. This oscillation is provided by the hold clock 42.

The dimensions of the memory cells depend primarily on two factors, the drive voltage and the detection sensitivity. If the width of one of the square electrode pads is denoted as the characteristic dimension of the cell, then the required drive voltage varies approximately as the characteristic dimension, while the capacitance varies inversely to the characteristic dimension. For example, if the characteristic dimension of the memory cell is 100 microns, an appropriate drive voltage is 100 volts and the change in capacitance between a stored (1) and a stored (0) is about 50 femtofarads. This assumes moderate electric field strength of a million volts per meter, and a slab whose dielectric constant is 76 and which fills approximately one half of the volume between the electrode plates. If the density of the slab and the surrounding material is matched to within twenty percent, the holding potentials should maintain the position of the slab in each cell for accelerations and vibrations up to 100 g's. An example of a possible slab material is water, with a dielectric constant of 76. A possible surrounding media is heptane, with some octyl alcohol added to prevent the water from wetting the insulator. Glass or silica, treated with an agent to make the surface hydrophobic, makes a good insulator. The electrodes can be metals, metal oxides, or highly doped semiconductors. Each assembly of electrodes and insulators would be mounted on a substrate, which again could be glass, and these assemblies would be held together with intervening spacers to maintain a constant thickness of the liquid film. Contact of the electrodes with external electronics is made by techniques well known in the art.

If the resistivity of the dielectric slab and surrounding media is high enough, it is not necessary to have the insulators separating the electrodes from the liquids. If good conductors are substituted for the dielectric slab, the cell will operate in the usual way, with the capacitance determined by the volume between the electrodes not filled by the mobile conductor.

The dielectrophoretic memory will typically have two distinct access speeds: the speed for reading from the memory, and the speed for writing to it. Reading speed is determined by the speed at which the address can be decoded, and by the speed at which the capacitance of the appropriate electrode pairs can be measured. This is similar to the reading mechanism in dynamic rams, and should be typically about a microsecond. Writing rates are slower. To first order, the speed to which a cell can be written is independent of the size of the cell. This is because the force on the slab is roughly proportional to the area of the slab entering the region being two activated electrodes, whereas the viscous drag is proportional to the radius and the switching time is proportional to the slab's length. Thus, for moderate electric field strengths of a million volts per meter, fifty percent volume filling of the space between the activated electrodes by the higher dielectric slab, and a viscosity of the surrounding media of a centipoise, the switching time is on the order of 100 microseconds. The time is inversely proportional to the viscosity and to the square of the electric field strength, so that conceivably this switching time could be considerably shortened. An alternative way to gain speed is to multiplex a number of such arrays together. For example, if one array could write 10,000 bits a second, ten arrays could write 100,000 bits a second.

The size of the array is limited principally by the detection sensitivity of the position of the dielectric slabs. If capacitance sensing is used, parasitic capacitance will eventually make the slab position undetectable in a very large array. This effect can be minimized by grounding all other electrodes when the mutual capacitance between two electrodes is being measured, and by measuring the differential capacitance between both electrode pairs of a memory cell.

The array-accessed two position cell is not the only workable geometry. As described in the previous section, the two position cell can be extended to an arbitrary number of positions. One consequence of this is that memories can be constructed in different bases, with the number of positions in the unit cell being equal to the base. Alternatively, a chain containing many positions of electrode pairs might be closed on itself, in a similar manner to the closed loops used in magnetic bubble memory. While this design is slower than random access, it might have advantages in interfacing and detection of the position of the dielectrics.

It has been found that high dielectric materials such as water with moderate viscosity and surface tension can be fissioned into smaller regions or bubbles. This fact allows, for example, individual slabs of dielectric material to be placed in every unit cell of an array simply by placing a holding field on half the electrodes, and then allowing a larger region of high dielectric material to be gravitationally drawn through the array. Small bubbles of high dielectric material will remain in its wake at each location of the strong electric field. This process implies an alternative memory design, where the size of the bubble between two electrodes determines the value stored. In this manner, analog signals might be stored by bubbles of a variety of sizes.

Differential capacitance sensing is the preferred sensing technique, however other possibilities exist. The position of a bubble could be detected optically if the bubble had different optical properties than the surrounding medium. For example, an optically dense bubble could act as a shutter across a transparent aperture. Then the bubble's position would be determined by whether or not the aperture was blocked. A resistivity measurement may prove more effective in a particular device. In this case, the leakage current between the two electrodes is measured instead of the capacitance. The resistivity might be quite low if no insulators are used, and the dielectric material has a moderate to good conductivity. Care is required such that electrochemistry does not take place at the electrodes if resistive sensing is used.

The preceding examples are by way of illustration of the application of dielectrophoresis to the storage and retrieval of electronically derived information and are not intended to restrict the scope of the invention, that scope being defined by the following claims and all equivalents thereto.

What is claimed is:

1. An apparatus for storing and retrieving information comprising:
   a housing containing first and second immiscible electrically neutral materials, said first and second materials having different dielectric constants,
   means for applying a non-uniform electrical field to said first and second materials for varying the relative position of said materials within said housing as a result of dielectrophoretic forces resultant from said applied non-uniform electrical field, the position of one of said materials within said housing corresponding to information to be stored, and
   means for detecting the position of said one material in said housing fo retrieving the information corresponding to said position of said one material.

2. The apparatus of claim 1 further including means for adjusting said non-uniform electric field applied to said first and second materials for varying the relative positions of said first and second materials within said housing.

3. The apparatus of claim 1 wherein said means for applying said non-uniform electrical field to said first and second materials within said housing includes:
   a first and second pair of opposed electrodes, said first and second pair being spaced apart from each other,
   the position of said first pair corresponding to a first digit of information and the position of said second pair corresponding to a second digit of information,
   means for selectively adjusting the charge on said electrodes of said first and second pairs for selectively moving said one material to a position between said first pair or to a position between said second pair as a result of dielectrophoretic forces resultant from said applied non-uniform electric field.

4. The apparatus of claim 3 wherein said means for detecting determines whether said one material is between said first or said second pair of electrodes.

5. The apparatus of claim 4 wherein said means for detecting includes means for sensing the mutual capacitance between one of said first and second pairs of electrodes,
   wherein a mutual capacitance above a predetermined level indicates that said one material is positioned between said one of said first and second pairs of electrodes, and a mutal capacitance below said predetermined level indicates that said one material is positioned between the other of said first and second pairs of electrodes.

6. The apparatus of claim 1 wherein said first material is a solid and said second material is a fluid, said first material having a dielectric constant greater than that of said second material.

7. The apparatus of claim 1 wherein said first material is a fluid and said second material is a fluid, said first material having a dielectric constant greater than said second material.

8. The apparatus of claim 1 wherein said first and second materials are both liquids, said first material having a dielectric constant greater than said second material.

9. The apparatus of claim 8 wherein the viscosity of said first material is greater than that of said second material.

10. The apparatus of claim 1 wherein said first and second materials have substantially equivalent densities.

11. An apparatus for storing and retrieving information comprising,
    a plurality of housings, each of said housings containing first and second electrically neutral materials having different dielectric constants and means for applying a non-uniform electric field to said materials to vary the position of said materials within said housing as a result of dielectrophoretic forces resultant from said applied non-uniform field, the position of one of said materials in each of said housings corresponding to information to be stored, and
    means for determining the position of said one material in each of said housings.

12. The apparatus of claim 11 further including means for varying said non-uniform electrical field applied to said first and second materials in each of said housings for selectively varying the position of said one material in each of said housings.

13. A method of storing and retrieving information comprising the steps of:
    providing first and second electrically neutral materials having different dielectric constants within a housing,
    applying a non-uniform electrical field to said materials to vary the relative position of said materials within said housing as a result of dielectrophoretic forces resultant from said applied non-uniform electrical field, the position of one of said materials within the housing corresponding to stored information, and
    detecting the position of said one material within said housing to retrieve said stored information.

14. The method of claim 13 further including the step of varying said applied non-uniform electrical field to vary the position of said one material within said housing.

15. The method of claim 13 wherein said non-uniform electrical field is provided by at least two points of electrodes and the position of said one material is detected by sensing the mutual capacitance between one of said pairs of electrodes.

* * * * *

UNITED STATES PATENT AND TRADEMARK OFFICE
CERTIFICATE OF CORRECTION

PATENT NO. : 4,402,062
DATED : August 30, 1983
INVENTOR(S) : J. Samuel Batchelder It is certified that error appears in the above—identified patent and that said Letters Patent is hereby corrected as shown below:

Col. 1, line 9, change "bu" to --by--; line 14, change "droplet" to --droplets--; line 29, change "No. 2,664,246 to --No. 2,665,246--. Col. 3, line 32, change "in" to --it--. Col. 4, line 1, change "of" to --if--; line 21, change "attached" to --attracted--. Col. 5, line 10, change "The" to --This--; line 31, change "is" to --in--; line 34, change "one" to --more-- Col. 6, line 14, change "effected" to --affected--. Col. 9, line 17, change "fo" to --for--.

Signed and Sealed this

Eleventh Day of September 1984

[SEAL]

Attest:

Attesting Officer

GERALD J. MOSSINGHOFF

Commissioner of Patents and Trademarks